(12) United States Patent
Kweon et al.

(10) Patent No.: US 6,391,660 B2
(45) Date of Patent: May 21, 2002

(54) METHOD FOR FABRICATING SEMICONDUCTOR MEMORY DEVICE HAVING FERROELECTRIC LAYER

(75) Inventors: Soon-Yong Kweon; Seung-Jin Yeom, both of Ichon-shi (KR)

(73) Assignee: Hyundai Electronics Industries Co., Ltd., Ichon-shi (KR)

( * ) Notice: Subject to any disclaimer, the term of this patent is extended or adjusted under 35 U.S.C. 154(b) by 0 days.

(21) Appl. No.: 09/891,255

(22) Filed: Jun. 27, 2001

(30) Foreign Application Priority Data

Jun. 30, 2000 (KR) ........................ 2000-36838

(51) Int. Cl.[7] ............................................. H01L 21/00
(52) U.S. Cl. ........................................ 438/3; 438/240
(58) Field of Search .......................... 438/3, 240, 243, 438/244, 253, 386, 387, 396

(56) References Cited

U.S. PATENT DOCUMENTS 5,879,956 A * 3/1999 Seon et al. ................ 438/3
5,913,117 A * 6/1999 Lee ......................... 438/3
6,323,044 B1 * 11/2001 Harris et al. ............. 438/240

* cited by examiner

*Primary Examiner*—Chandra Chaudhari
(74) *Attorney, Agent, or Firm*—Jacobson Holman, PLLC

(57) ABSTRACT

A method for fabricating a semiconductor memory device is provided which can omit a fabricating step of removing a seed layer. The method for fabricating a semiconductor memory device includes the steps of a) providing a semiconductor structure, wherein the semiconductor structure has an insulating layer formed on a semiconductor substrate; b) forming a seed layer on an insulating layer covering the semiconductor substrate; c) forming a sacrifice layer on the seed layer; d) selectively etching the sacrifice layer to expose the seed layer, thereby defining an opening; e) forming a lower electrode layer on the seed layer disposed within the opening; f) removing the sacrifice layer to expose the lower electrode and a portion of the seed layer not covered by the lower electrode; g) oxidizing the exposed portion of the seed layer to form an insulating layer; and h) sequentially forming a ferroelectric layer and an upper electrode on the lower electrode.

11 Claims, 6 Drawing Sheets

METHOD FOR FABRICATING SEMICONDUCTOR MEMORY DEVICE HAVING FERROELECTRIC LAYER

FIELD OF THE INVENTION

The present invention relates to a semiconductor memory device and, more particularly, to a method for fabricating a semiconductor memory device, in which a fabricating step of removing a seed layer can be omitted.

DESCRIPTION OF THE PRIOR ART

With the recent progress of film deposition techniques, applications of a nonvolatile memory cell using a ferroelectric thin film have increasingly been developed. This nonvolatile memory cell is a high-speed rewritable nonvolatile memory cell utilizing the high-speed polarization/inversion and the residual polarization of the ferroelectric capacitor thin film.

Therefore, a ferroelectric random access memory (FeRAM) having a capacitor thin film with ferroelectric properties, such as strontium bismuth tantalate (SBT) and lead zirconate titanate (PZT), is increasingly used for a capacitor, because it assures a low-voltage and high-speed performance, and does not require periodic refresh to prevent loss of information during standby intervals like a dynamic random access memory (DRAM).

Since a ferroelectric material has a dielectric constant ranging in value from hundreds to thousands, and stabilized residual polarization property at room temperature, it is being applied to the non-volatile memory device as the capacitor thin film. When employing the ferroelectric capacitor thin film in the non-volatile memory device, information data are stored by polarization of dipoles when an electric field is applied thereto. Even if the electric field is removed, the residual polarization remains so that one of information data, i.e., "0" or "1", can be stored.

FIGS. 1A to 1C are cross-sectional views showing sequential steps for fabricating a conventional FeRAM device.

Referring to FIG. 1A, a transistor (not shown) is formed on a semiconductor substrate 10 to thereby provide a semiconductor structure. Then, a first interlayer insulating layer 12 is selectively etched to define a contact hole which exposes a source/drain region 11 contained in the transistor. Thereafter, a plug is formed by stacking a polysilicon plug 13, $TiSi_2$ layer 14 and TiN layer 15, and a seed layer 16 is formed on the entire resulting structure.

Referring to FIG. 1B, the seed layer 16 is selectively etched to form a patterned seed layer 16A.

Referring to FIG. 1C, a lower electrode 17 is formed on the patterned seed layer 16A by electrochemical deposition (ECD), and then a ferroelectric layer 18 and an upper electrode 19 are sequentially stacked thereon. Thereafter, the upper electrode 19 and the ferroelectric layer 18 are patterned to thereby form a capacitor.

As described above, when the lower electrode is formed by the ECD, the seed layer is necessarily required. Additionally, since the seed layer existing outside the lower electrode should be removed, the fabricating steps become complicated.

SUMMARY OF THE INVENTION

It is, therefore, an object of the present invention to provide a method for fabricating a semiconductor memory device in which a fabricating step of removing a seed layer can be omitted.

In accordance with an aspect of the present invention, there is provided a method for fabricating a semiconductor memory device, comprising steps of a) providing a semiconductor structure, wherein the semiconductor structure has an insulating layer formed on a semiconductor substrate; b) forming a seed layer on an insulating layer covering the semiconductor substrate; c) forming a sacrifice layer on the seed layer; d) selectively etching the sacrifice layer to expose the seed layer, thereby defining an opening; e) forming a lower electrode layer on the seed layer disposed within the opening; f) removing the sacrifice layer to expose the lower electrode and a portion of the seed layer not covered by the lower electrode; g) oxidizing the exposed portion of the seed layer to form an insulating layer; and h) sequentially forming a ferroelectric layer and an upper electrode on the lower electrode.

In accordance with another aspect of the present invention, there is provided a method for fabricating a semiconductor memory device, comprising steps of a) providing a semiconductor structure, wherein the semiconductor structure includes a transistor formed on a semiconductor substrate; b) forming an interlayer insulating layer on the semiconductor structure; c) exposing a source/drain region contained in the transistor by selectively etching the interlayer insulating layer, thereby defining a contact hole; d) forming a plug within the contact hole; e) forming a seed layer on an entire resulting structure; f) forming a sacrifice layer on the seed layer; g) exposing the seed layer by selectively etching the sacrifice layer to thereby define an opening for defining a lower electrode region; h) forming a lower electrode on the seed layer disposed within the opening; i) removing the sacrifice layer to expose the lower electrode and a portion of the seed layer not covered by the lower electrode; j) oxidizing the exposed portion of the seed layer to form an insulating layer; and k) sequentially forming a ferroelectric layer and an upper electrode on the lower electrode.

BRIEF DESCRIPTION OF THE DRAWINGS

Other objects and aspects of the invention will become apparent from the following description of the embodiments with reference to the accompanying drawings, in which.

DETAILED DESCRIPTION OF THE PREFERRED EMBODIMENTS

FIGS. 2A to 2G are cross-sectional views illustrating sequential steps of fabricating a ferroelectric memory device in accordance with the present invention.

Figure 1A:
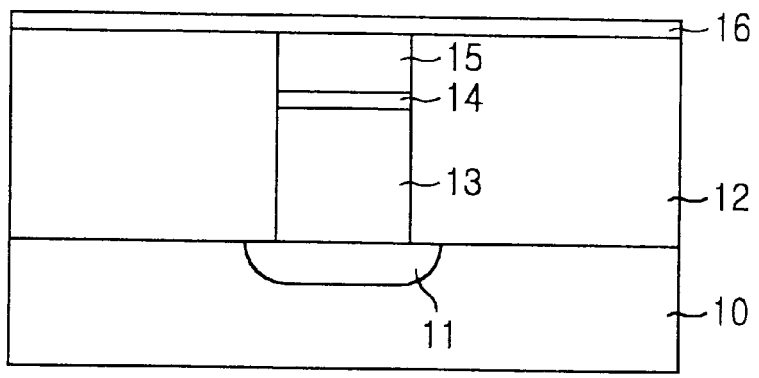
FIGS. 1A to 1C are cross-sectional views showing sequential steps for fabricating a conventional FeRAM device.
Figure 1B:
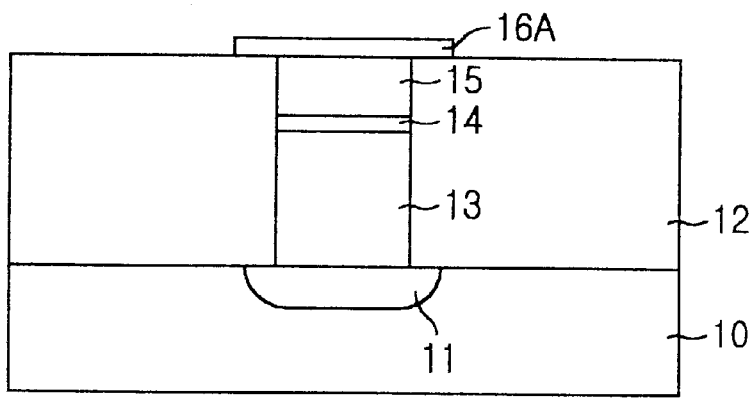
Figure 1C:
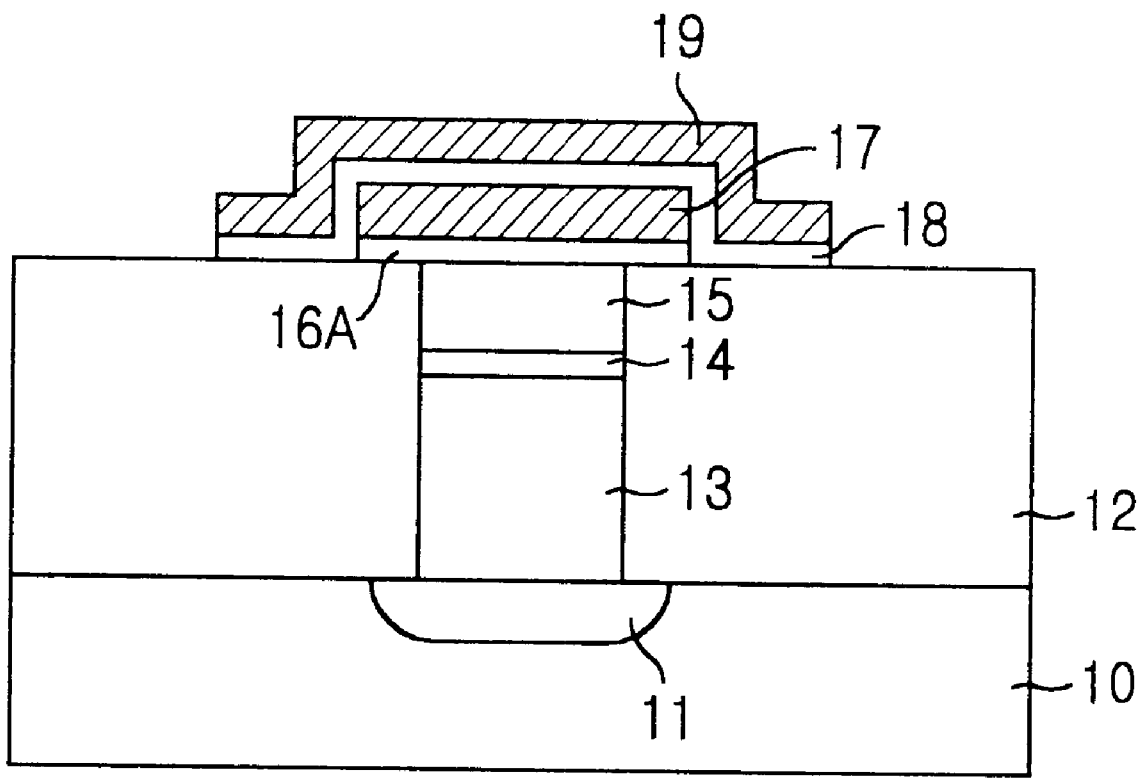
Figure 2A:
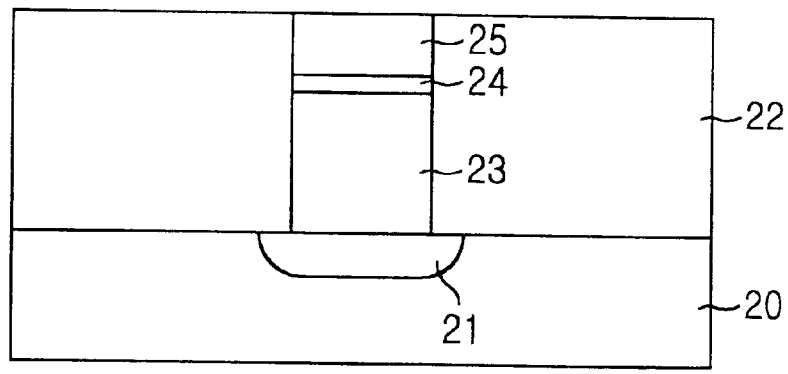
FIGS. 2A to 2G are cross-sectional views illustrating sequential steps of fabricating a ferroelectric memory device in accordance with the present invention.

Referring to FIG. 2A, a transistor (not shown) is formed on a semiconductor substrate 20 to thereby provide a semiconductor structure. A first interlayer insulating layer 22 is formed on the semiconductor structure, and an etching process is then carried out to define a contact hole exposing a source/drain region 21 contained in the transistor. Thereafter, a polysilicon layer 23 is deposited on an entire resulting structure, and a portion of the polysilicon layer 23 is removed. Then, the formation of a Ti silicide layer is carried out to form a TiSi$_2$ layer 24, and an oxide barrier layer 25 is formed on the TiSi$_2$ layer 24. Sequentially, a chemical mechanical polishing (CMP) is carried out to thereby form a plug within the contact hole.

Figure 2B:
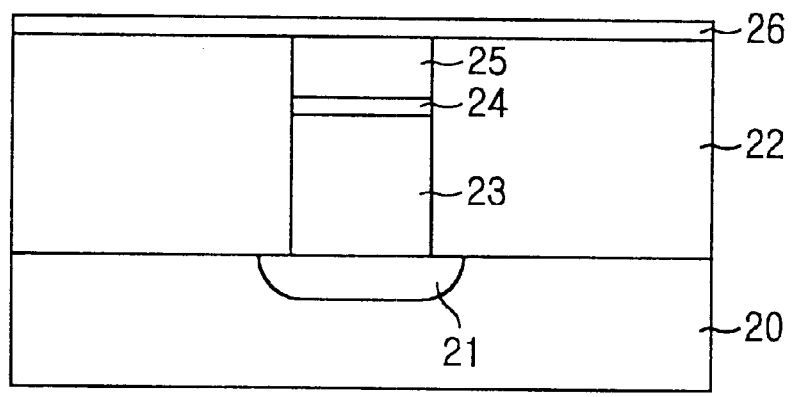

Referring to FIG. 2B, a seed layer 26 is formed on an entire structure to a thickness of 50 Å to 500 Å by using a chemical vapor deposition (CVD) or an atomic layer deposition (ALD). At this time, the seed layer 26 can be formed with a material selected from the group consisting of Ti, TiN, TiAlN, TiSiN, Ta, TaN and TaAlN.

Figure 2C:
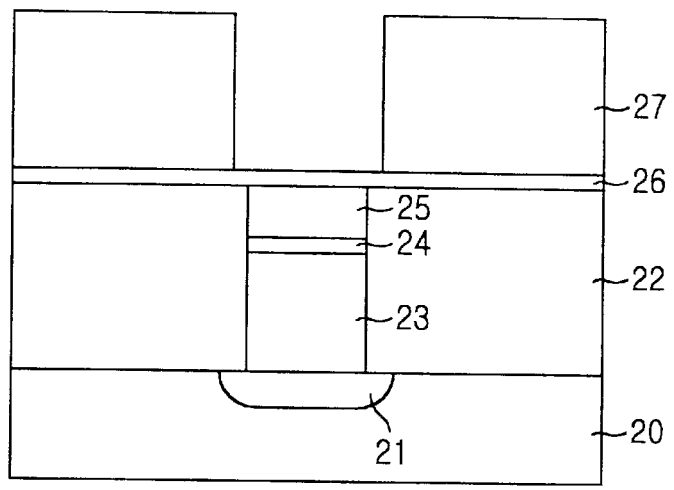

Referring to FIG. 2C, a sacrifice layer 27 is formed on the seed layer 26, and the sacrifice layer 27 is selectively etched to define an opening that is in contact with the plug.

Figure 2D:
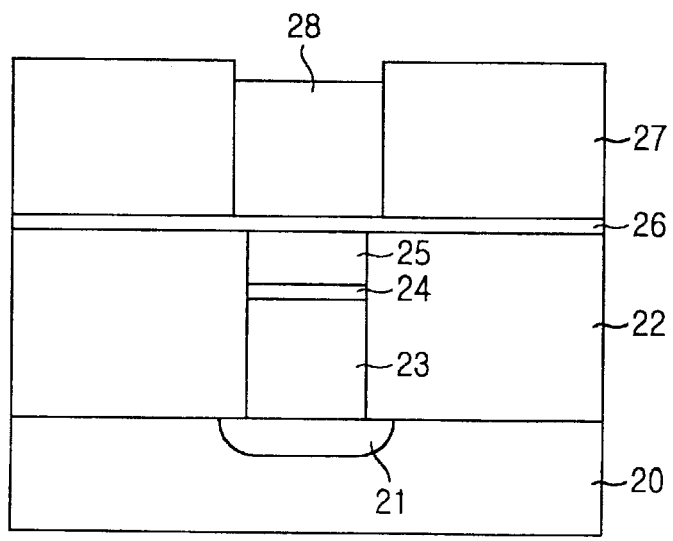

Referring to FIG. 2D, a lower electrode 28 is formed with Ir or Ru within the opening to a thickness of 1000 Å to 10000 Å by using ECD method. After forming the lower electrode, a furnace annealing process is carried out for 5 hours or a rapid thermal annealing (RTA) process is carried out for a period ranging from 1 second to 10 minutes. At this time, these processes are carried out in an O$_2$ or O$_3$ atmosphere and at a temperature of 400° C. to 700° C. Preferably, it is possible to perform a plasma process using O$_2$ or O$_3$ gas.

As described above, since the lower electrode 28 is formed with materials such as Ir and Ru, which has an improved oxygen barrier characteristic, it is possible to prevent the seed layer 26 from being oxidized during a following thermal treatment that is carried out under the oxygen atmosphere.

Figure 2E:
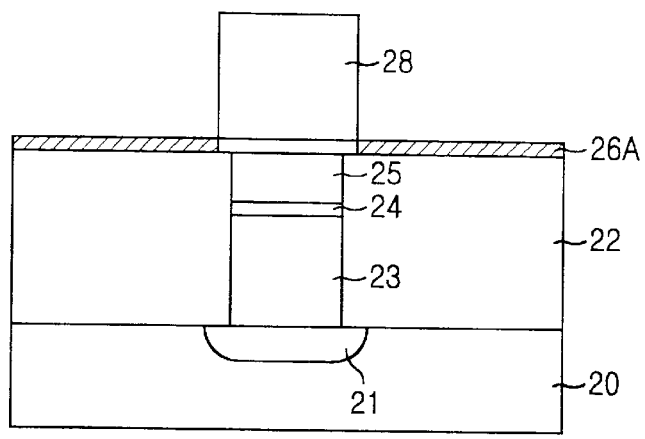

Referring to FIG. 2E, a wet or dry etching process is carried out to remove the sacrifice layer 27, and the seed layer 26 which is not covered by the lower electrode 28 is exposed. Then, an exposed portion of the seed layer 26 is oxidized by carrying out a thermal treatment under the oxygen atmosphere to form an oxidized seed layer 26A. At this time, since the oxidized seed layer 26A acts as an insulating layer, if not removed, the oxidized seed layer 26A does not influence device characteristics.

Figure 2F:
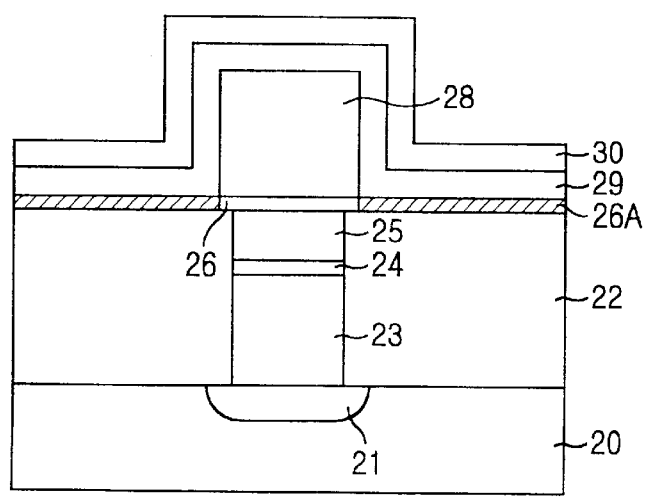

Referring to FIG. 2F, one of SBT (SrBi$_2$Ta$_2$O$_9$), SBTN (Sr$_x$Bi$_{2-y}$(Ta$_{1-z}$Nb$_2$)$_2$O$_9$), PZT (Pb(Zr$_x$Ti$_{1-x}$)O$_3$) and BLT (Bi$_{4-x}$La$_x$Ti$_3$O$_{12}$) is deposited by using a chemical vapor deposition (CVD) or an atomic layer deposition (ALD), thereby obtaining a ferroelectric layer 29 formed to a thickness of 50 Å to 2000 Å. Then, a thermal treatment is carried out at a temperature of 400° C. to 700° C. This thermal treatment is also carried out for a period ranging from 10 minutes to 5 hours in an atmosphere containing O$_2$, N$_2$, Ar, O$_3$, He or Ne. Thereafter, an upper electrode 30 is formed on the ferroelectric layer 29.

Figure 2G:
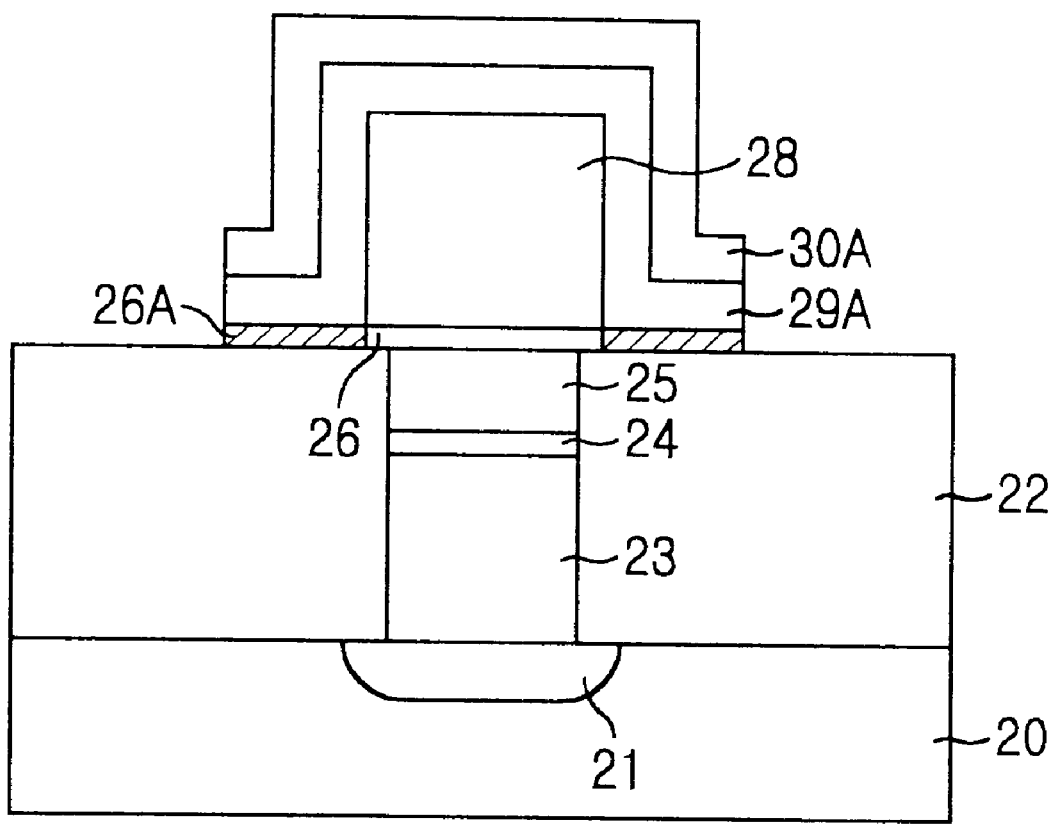

Referring to FIG. 2G, the upper electrode 30 and the ferroelectric layer 29 are patterned by using a photolithography technique or an etching process, thereby forming an upper electrode pattern 30A and a ferroelectric pattern 29A. Then, a back-end process is carried out by performing well-known processes.

As described above, since the seed layer remaining outside the lower electrode is oxidized and thereby changed into an insulating layer, the additional step of removing the seed layer can be omitted. Additionally, since the seed layer has an improved characteristic in an adhesion to the oxide materials, the formation of an adhesion layer can be omitted, so that fabricating steps are simplified.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method for fabricating a semiconductor memory device, comprising steps of:
   a) providing a semiconductor structure, wherein the semiconductor structure has an insulating layer formed on a semiconductor substrate;
   b) forming a seed layer on an insulating layer covering the semiconductor substrate;
   c) forming a sacrifice layer on the seed layer;
   d) selectively etching the sacrifice layer to expose the seed layer, thereby defining an opening;
   e) forming a lower electrode layer on the seed layer disposed within the opening;
   f) removing the sacrifice layer to expose the lower electrode and a portion of the seed layer not covered by the lower electrode;
   g) oxidizing the exposed portion of the seed layer to form an insulating layer; and
   h) sequentially forming a ferroelectric layer and a upper electrode on the lower electrode.

2. The method as recited in claim 1, wherein the seed layer is formed with a material selected from the group consisting of Ti, TiN, TiAlN, TiSiN, Ta, TaAlN and TaAlN.

3. The method as recited in claim 2, wherein the ferroelectric layer is formed with a material selected from the group consisting of SBT (SrBi$_2$Ta$_2$O$_9$), SBTN (Sr$_x$Bi$_{2-y}$(Ta$_{1-z}$Nb$_2$)$_2$O$_9$), PZT (Pb(Zr$_x$Ti$_{1-x}$)O$_3$) and BLT (Bi$_{4-x}$La$_x$Ti$_3$O$_{12}$).

4. The method as recited in claim 3, wherein the ferroelectric layer is formed by using a chemical vapor deposition (CVD) or an atomic layer deposition (ALD).

5. The method as recited in claim 4, further comprising a step of carrying out a thermal treatment in an atmosphere containing O$_2$, N$_2$, Ar, O$_3$, He or Ne.

6. A method for fabricating a semiconductor memory device, comprising steps of:
   a) providing a semiconductor structure, wherein the semiconductor structure includes a transistor formed on a semiconductor substrate;
   b) forming an interlayer insulating layer on the semiconductor structure;
   c) exposing a source/drain region contained in the transistor by selectively etching the interlayer insulating layer, thereby defining a contact hole;
   d) forming a plug within the contact hole;
   e) forming a seed layer on an entire resulting structure;
   f) forming a sacrifice layer on the seed layer;
   g) exposing the seed layer by selectively etching the sacrifice layer to thereby defining an opening;
   h) forming a lower electrode on the seed layer disposed within the opening;
   i) removing the sacrifice layer to expose the lower electrode and a portion of the seed layer not covered by the lower electrode;
   j) oxidizing the exposed portion of the seed layer to form an insulating layer; and
   k) sequentially forming a ferroelectric layer and an upper electrode on the lower electrode.

7. The method as recited in claim 6, wherein the seed layer is formed with a material selected from the group in consisting of Ti, TiN, TiAlN, TiSiN, Ta, TaAlN and TaAlN.

8. The method as recited in claim 7, wherein the ferroelectric layer is formed with a material selected from the group consisting of SBT ($SrBi_2Ta_2O_9$), SBTN ($Sr_xBi_{2-y}(Ta_{1-z}Nb_2)_2O_9$), PZT ($Pb(Zr_xTi_{1-x})O_3$) and BLT ($Bi_{4-x}La_xTi_3O_{12}$).

9. The method as recited in claim 8, wherein the ferroelectric layer is formed by using a chemical vapor deposition (CVD) or an atomic layer deposition (ALD).

10. The method as recited in claim 9, further comprising a step of carrying out a thermal treatment in an atmosphere containing $O_2$, $N_2$, Ar, $O_3$, He or Ne.

11. The method as recited in claim 10, wherein the plug is formed by stacking a polysilicon layer, a silicide layer and a diffusion barrier layer.

* * * * *